United States Patent [19]
Pezzani

[11] Patent Number: 5,883,401
[45] Date of Patent: Mar. 16, 1999

[54] MONOLITHIC SEMICONDUCTOR SWITCH AND SUPPLY CIRCUIT COMPONENT

[75] Inventor: Robert Pezzani, Vouvray, France

[73] Assignee: SGS-Thomson Microelectronics S.A., Saint Genis, France

[21] Appl. No.: 650,127

[22] Filed: May 17, 1996

[30] Foreign Application Priority Data

May 19, 1995 [FR] France .................................. 95 06265

[51] Int. Cl.$^6$ ......................... H01L 29/74; H01L 31/111
[52] U.S. Cl. ........................ 257/121; 257/137; 257/146; 257/154
[58] Field of Search ................................. 257/121, 137, 257/146, 154

[56] References Cited

U.S. PATENT DOCUMENTS

| | | | |
|---|---|---|---|
| 4,503,359 | 3/1985 | Watanabe et al. | 315/105 |
| 4,673,844 | 6/1987 | Maytum et al. | |
| 4,694,315 | 9/1987 | Svedberg. | |
| 4,791,470 | 12/1988 | Shinohe et al. | |
| 4,956,690 | 9/1990 | Kato. | |
| 4,992,844 | 2/1991 | Yakushiji. | |
| 5,023,521 | 6/1991 | Sridharan | 315/290 |
| 5,138,415 | 8/1992 | Yano. | |
| 5,272,363 | 12/1993 | Pezzani | 257/173 |

FOREIGN PATENT DOCUMENTS

| | | | |
|---|---|---|---|
| A-0 101 543 | 2/1984 | European Pat. Off. | G01V 9/04 |
| A-2 222 801 | 10/1974 | France | H03K 17/56 |
| A-2 541 843 | 10/1984 | France | H05B 41/23 |
| A-21 27 956 | 12/1972 | Germany | H03K 17/56 |

Primary Examiner—Ngân V. Ngô
Attorney, Agent, or Firm—Wolf, Greenfield & Sacks, P.C.

[57] ABSTRACT

A monolithic semiconductor component has a first thyristor having a gate, an anode and a cathode. The gate is connected to the cathode through a first resistor and to the anode through the series connection of a zener diode and a second thyristor. The thyristors are of the vertical type and the zener diode is of the lateral type. The cathode of the zener diode is connected to the cathode of the second thyristor through a metallization forming an output terminal.

24 Claims, 4 Drawing Sheets

5,883,401

MONOLITHIC SEMICONDUCTOR SWITCH AND SUPPLY CIRCUIT COMPONENT

BACKGROUND OF THE INVENTION

1. Field of the Invention

The present invention relates to solid-state switches and more particularly to solid-state switches whose operation is controllable by an integrated circuit.

2. Discussion of the Related Art

A controllable switch may be designed for connection in a circuit in series with a load whose current will be adjusted. A practical problem of such an arrangement is that the control integrated circuit should be supplied with a specific low voltage supply (in some examples 5 to 15 volts). Thus, it may be desired to form units which each include the switch and a power supply for the integrated circuit, which significantly simplifies the mounting of these switches and of their control integrated circuit.

FIG. 1 illustrates a circuit which includes a voltage source S supplying a load L in series with a switching unit 1. The switching unit 1 is controlled by an integrated circuit IC, and includes the switch SW connected between terminals A1 and A2, and output terminals 2 and 3 to supply the integrated circuit. A specific problem raised by such an arrangement is that, when switch SW is turned-on, the voltage between the terminals of switch SW is low or zero and therefore the voltage across terminals 2 and 3 may be too low to provide power to the integrated circuit IC. To avoid this drawback, it has been devised to connect a storing capacitor C between terminals 2 and 3.

Such devices satisfactorily operate but require a high-value capacitor C for long-lasting switching-on of the switch SW. Indeed, if source S corresponds to the a.c. voltage of the mains or to the rectified mains voltage, the case in which the control of the switch causes its closing during several periods of the mains voltage must be provided for.

To solve this problem, a switch has been associated with a low-voltage supply circuit designed so that, when a switch-on order is transmitted to the switch, this order is inhibited as long as the voltage across the switch has not reached the desired threshold supply voltage. Thus, a storing capacitor can be charged again at the beginning of each half-period of the voltage applied and thus can be a small size capacitor.

Such a circuit is disclosed in French patent 2222801. However the implementation of such a circuit implies the use and the connection of a large number of components.

SUMMARY OF THE INVENTION

An object of the present invention is to provide a unit having a switch function and a supply function, which can be achieved in the form of a monolithic semiconductor component.

To attain this object, an embodiment of the present invention provides a monolithic semiconductor component comprising a first thyristor having a gate, an anode and a cathode, the gate being connected to the cathode through a first resistor and to the anode through the series connection of a zener diode and a second thyristor. The thyristors are of the vertical type and the zener diode is of the lateral type, the cathode of the zener diode being connected to the cathode of the second thyristor through a metallization forming an output terminal.

According to an embodiment of the invention, the zener diode is formed in the gate well of the first transistor.

According to an embodiment of the invention, a contact is formed between the metallization and a gate well of the first thyristor, whereby a resistor is formed in parallel According to an embodiment of the invention, a diode is formed in a well at an upper surface of the component and is connected between the junction of the zener diode and the second thyristor and said output terminal.

According to an embodiment of the invention, a third thyristor of the lateral type has a cathode formed in the cathode-gate well of the first thyristor, the cathode of the zener diode being connected to the anode of the third thyristor, the anode of the zener diode being connected to the gate of the third thyristor.

According to an embodiment of the invention, a fourth thyristor of the vertical type complementary to the first thyristor forms therewith a triac.

DETAILED DESCRIPTION

Figure 1:
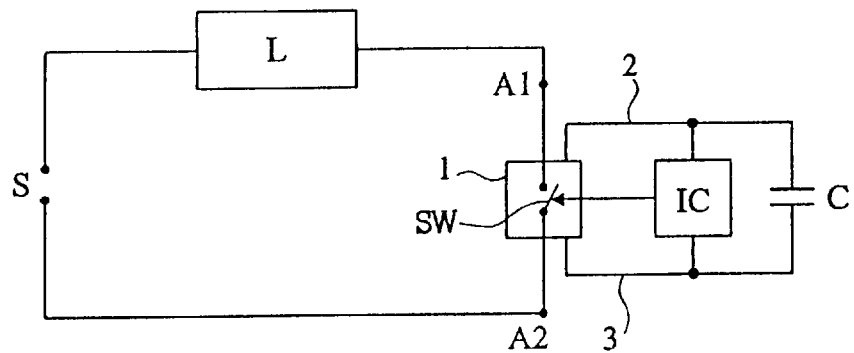
FIG. 1 represents a circuit including a switch and supply unit according to the prior art.
Figure 2A:
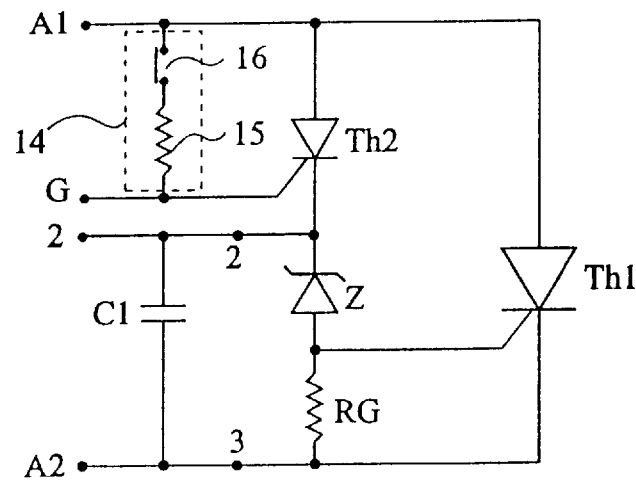
FIG. 2A represents an example of a circuit of a switch and supply unit.

FIG. 2A represents an example of a circuit which ensures the function of the unit 1 of FIG. 1. This circuit is designed to be connected by terminals A1 and A2 to the terminals of a load and of a supply source, as shown in FIG. 1. To simplify the explanation, it will be assumed that terminal A2 is a ground terminal.

Switch SW corresponds to a main thyristor Th1. The gate of thyristor Th1 is connected to the cathode of thyristor Th1 through a resistor RG. The gate of thyristor Th1 is further connected to the anode of a zener diode Z having its cathode connected to the cathode of an auxiliary thyristor Th2. The anode of thyristor Th2 is connected to the anode of thyristor Th1. The junction of thyristor Th2 and of zener diode Z corresponds to terminal 2 of FIG. 1. Terminal A2, or ground terminal, corresponds to terminal 3 of FIG. 1. A supply voltage which can, for example, supply an integrated circuit IC is available between these terminals 2 and 3. A storing capacitor C1 is disposed between terminals 2 and 3. The gate terminal G of thyristor Th2 is designed to receive a control signal from the integrated circuit which is supplied through terminals 2 and 3. A triggering circuit 14, for example constituted by a resistor 15 in series with a push button switch 16 is provided between the gate and anode of the thyristor Th2.

When it is desired to start-up a regulated control of the current in load L, one pushes the push button 16. This renders thyristor Th2 conductive. During a first period of conduction, the thyristor Th2 charges capacitor C1 until the voltage across capacitor C1 reaches the threshold voltage of the zener diode Z. Thereafter, capacitor C1 is sufficiently charged to supply the integrated circuit IC which provides control signals at the gate terminal G of the thyristor. The push button 16 is then released to enable the system to operate in a mode regulated by its control integrated circuit IC. Each time that a gate signal is applied to thyristor Th2, during a first period, capacitor C1 is charged again and then a current flows in the gate of thyristor Th1 which becomes conductive.

Figure 3:
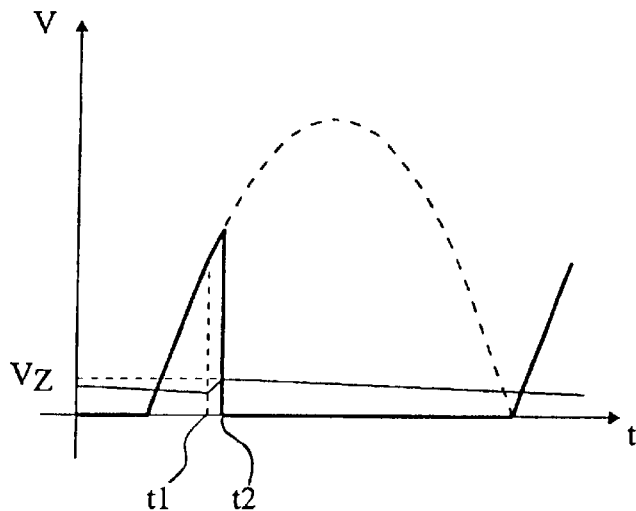
FIG. 3 represents a curve of the voltage as a function of time which illustrates the operation of the circuit of FIG. 2.

FIG. 3 illustrates the operation of this circuit in steady state. It is assumed that source S corresponds to the rectified voltage of the mains (for example, a mains in which the peak voltage is approximately 300 V). If, at time $t_1$, a control signal is applied to terminal G, thyristor Th2 becomes conductive and, during a first period, between times $t_1$ and $t_2$, capacitor C1 is charged. Then, when the voltage across capacitor C1 reaches the avalanche voltage VZ of the zener diode Z, thyristor Th1 becomes conductive. This occurs at each half-period. A similar phenomenon would occur in the case of a non-rectified a.c. source; in this case, control would occur only during the positive half-periods.

In fact, the time interval $t_1$–$t_2$ is typically very short because, as indicated above, voltage VZ is approximately 10 V whereas the peak voltage of the source signal is approximately 300 V in usual applications.

An embodiment of the present invention aims at implementing the circuit of FIG. 2A in the form of a monolithic component from an N-type semiconductor substrate 21, at least for components Th2, Z, RG and Th1.

Figure 2B:
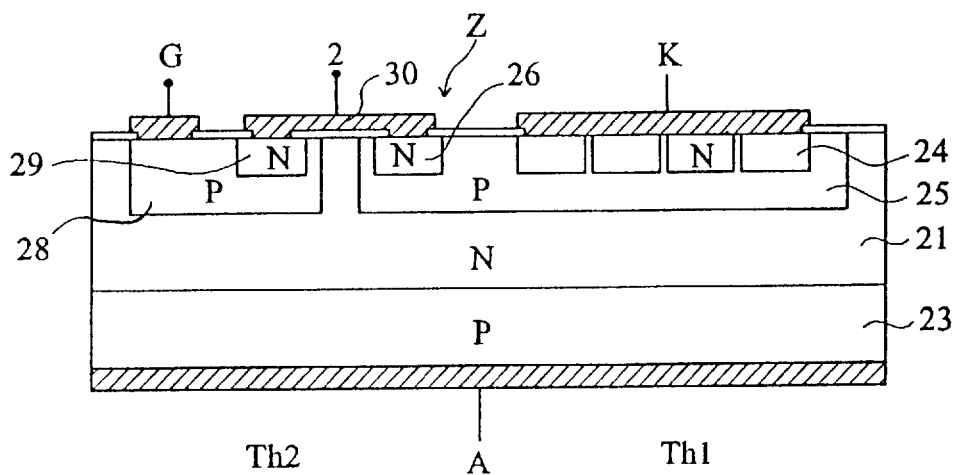
FIG. 2B represents a monolithic implementation of the circuit of FIG. 2A according to an embodiment of the present invention.

FIG. 2B illustrates such an implementation. The bottom surface of the component includes a P-type layer 23 coated with a bottom surface metallization A which corresponds to the anode of thyristors Th1 and Th2. Thyristor Th1 is vertically disposed and includes from the upper surface a cathode layer 24 having emitter shorts, formed in a P-type well 25, in turn formed in substrate 21. In a portion of well 25 is formed an N-type region 26 which forms with well 25 a zener junction corresponding to diode Z. A second P-type well 28 including an N-type region 29 forms the vertical thyristor Th2. Thyristor Th2 includes regions 29, 28, 21 and 23. The cathode 29 of thyristor Th2 is connected through a metallization 30 to the cathode 26 of the zener diode Z.

Metallization 30 corresponds to the supply terminal 2 of FIG. 2A. The well 28 is coated with a gate metallization G. Resistor RG is formed by the resistance of region 25 beneath the cathode layer 24.

It will be noted that FIG. 2B, like all the annexed figures which represent cross-sectional views of semiconductor components, is very schematic, as usual in the field of representation of semiconductor components.

Those skilled in the art will be able to adjust the surface and the disposition of the various layers and regions to optimize the characteristics of the component and more particularly the possible current flow and the zener voltage.

As is apparent to those skilled in the art various modifications can be made to the circuit of FIG. 2A and its monolithic implementation and some variants are described hereinafter.

Figure 4A:
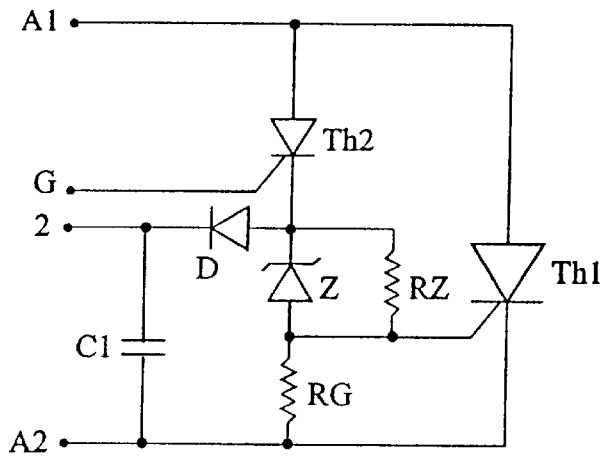
FIG. 4A represents another example of a circuit of a switch and supply unit.
Figure 4B:
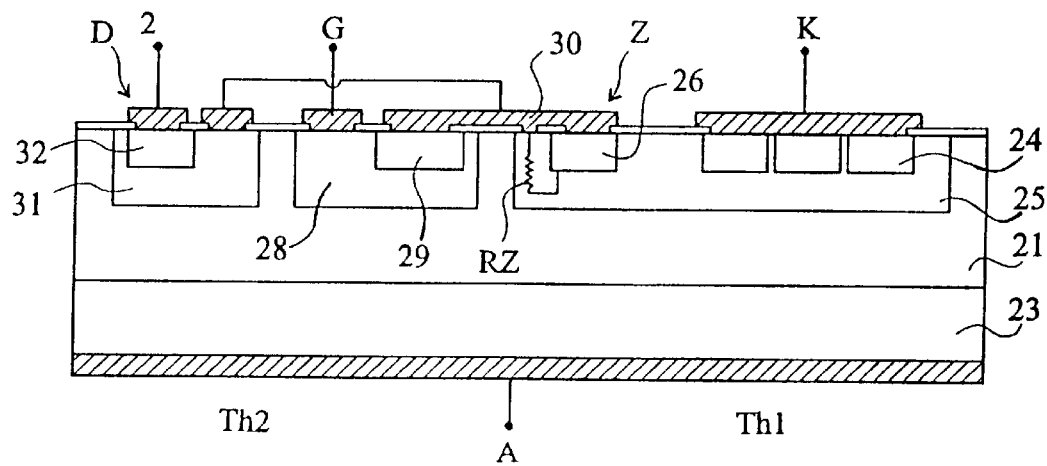
FIG. 4B represents a monolithic implementation of the circuit of FIG. 4A according to an embodiment of the present invention.

A first variant of this circuit is described in FIG. 4A and its realization in the form of a monolithic component is illustrated in FIG. 4B.

FIG. 4A represents the same elements as in FIG. 2A except for the start-up circuit 14. Furthermore, the circuit of FIG. 4A includes a diode D and a resistor RZ. The diode D is disposed between the junction of thyristor Th1 with the zener diode Z and terminal 2. Resistor RZ is disposed in parallel with the zener diode Z. This structure may be advantageous over the previous structure in that the control voltage at gate G with respect to ground at terminal A2 can be within a range of usual values whereas, in the case of the circuit of FIG. 2A, the voltage should be higher by VZ than these usual values. In the circuit of FIG. 2A a voltage booster may be provided with the integrated circuit IC generating signal G so that the supply voltage of this integrated circuit IC would precisely correspond to the voltage of the zener diode Z.

A monolithic implementation of the circuit of FIG. 4A is illustrated in FIG. 4B. This monolithic component includes the same components as those shown in FIG. 2B and an additional P-type well 31 which has an N-type region 32. The well 31 is coated with a metallization which is connected to the metallization 30 described in FIG. 2; these metallizations are no longer connected to an external terminal. Region 32 is coated with a metallization which is connected to terminal 2 designed to be connected to capacitor C1. The junction between regions 31 and 32 forms the diode D. In addition, the metallization 30, close to region 26, contacts both region 26 and a portion of the P-type well 25 so as to form a resistance RZ in parallel with diode Z.

Figure 5A:
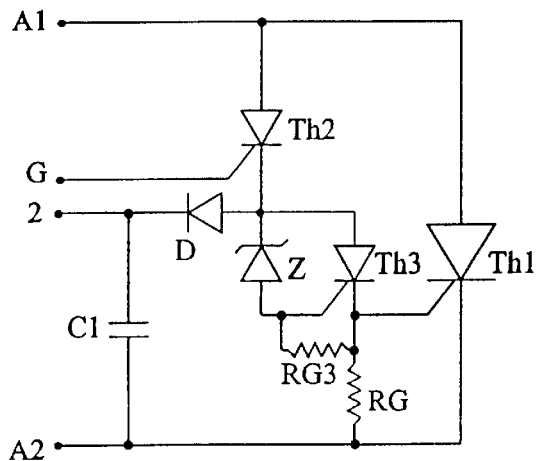
FIG. 5A represents another example of a circuit of a switch and supply unit.

A second alternative of the circuit of FIG. 2A is illustrated in FIG. 5A. In FIG. 5A, the resistor RZ of FIG. 4A is replaced with a thyristor Th3 having an anode connected to the cathode of the zener diode Z, a cathode connected to resistor RG, and a gate connected to the anode of diode Z. In addition, a resistor RG3 is disposed between the gate and cathode of thyristor Th3. This arrangement constitutes a gate current amplification system for thyristor Th1 and allows the use of a thyristor Th1 which is little sensitive to spurious triggering and in which a high current can flow.

Figure 5B:
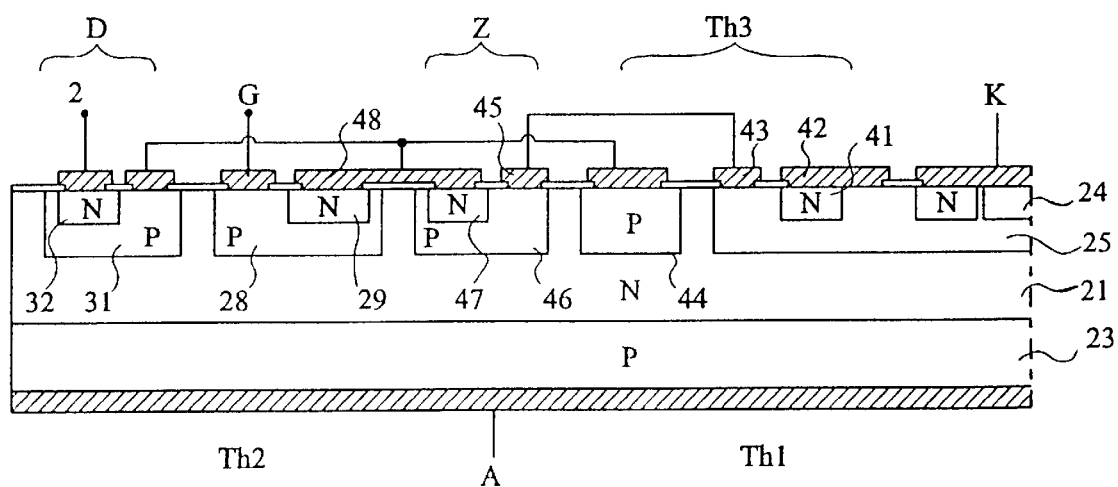
FIG. 5B represents a monolithic implementation of the circuit of FIG. 5A according to an embodiment of the present invention.

FIG. 5B represents a structure implementing the circuit of FIG. 5A. The right portion of FIG. 5B represents the vertical thyristor Th1 formed by regions 24, 25, 21 and 23. Thyristor Th3 is disposed laterally. The cathode of thyristor Th3 is constituted by an N-type region 41 formed in well 25 which forms the gate region of thyristor Th3. The anode of thyristor Th3 is constituted by a P-type region 44 formed near the well 25. Thyristor Th3 includes, from its anode to its cathode, regions 44, 21, 25, 41. The cathode region 41 is coated with a metallization 42 which also contacts a portion of the surface of well 25 to form the junction between the cathode of thyristor Th3 and the gate of thyristor Th1. A portion of well 25, which also forms the gate of thyristor Th3, is coated with a metallization 43 coupled to a metallization 45 formed in the upper surface of a well 46 which forms the anode of the zener diode Z. A diffused region 47 forms the cathode of the zener diode Z and is connected through a metallization 48 to an N-type region 29 formed in a well 28 which correspond to the cathode and the gate region of the vertical thyristor Th2, respectively. A gate metallization G contacts a portion of well 28. The left portion of FIG. 5B represents again the well 31 and the N-type region 32 corresponding to diode D of FIG. 4. The cathode 32 of diode D is coated with a metallization to be connected to terminal 2. The anode of the diode is in contact with a metallization coupled to the metallization 48 described above.

The embodiments of FIGS. 4A and 5A can be combined by providing a resistor in parallel with zener diode Z. This leads to modify the structure of FIG. 5B by providing a contact between metallization 48 and a portion of well 46, in the same way as in FIG. 4B a contact between metallization 30 and a portion of the well 25 was provided.

Figure 6A:
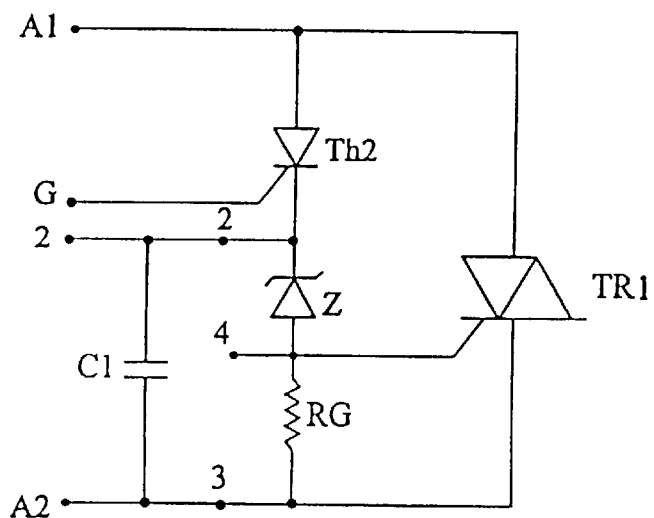
FIG. 6A represents another example of a circuit of a switch and supply unit.

A fourth alternative of the circuit of FIG. 2A (which does not include the start-up circuit 14) is shown in FIG. 6A, in which thyristor Th1 is replaced with a triac TR1. The gate of triac TR1 is further connected to a terminal 4 designed to be connected to the control integrated circuit to enable the triac to be conductive during the negative half-periods.

Figure 6B:
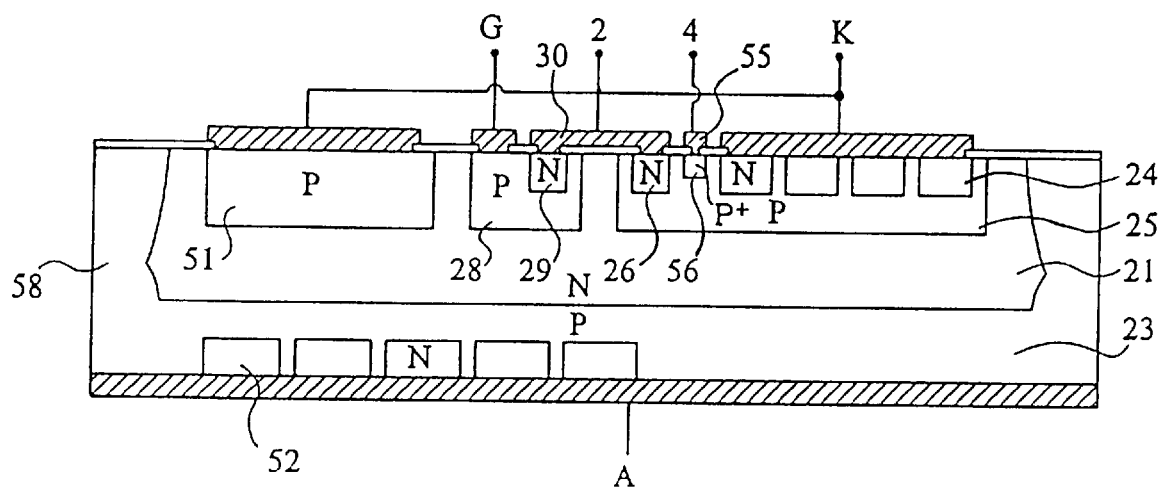
FIG. 6B represents a monolithic implementation of the circuit of FIG. 6A according to an embodiment of the present invention.

FIG. 6B represents an implementation of this circuit. The right portion of FIG. 6B represents the same layers, wells and regions as those in FIG. 2B. In addition, a P-type well 51 is formed in the upper portion of the substrate and, on the lower surface side, beneath well 51 and at least a portion of the gate region 28, is formed an N-type region 52 having shorting holes. Regions 51, 21, 23 and 52 thus form the second thyristor of the triac. A metallization coating well 51 is connected to the metallization which connects region 26 and forms a main triac electrode, referenced K as above. A metallization 55 contacts a highly doped P-type region 56 of the well 25 and is designed to form the gate terminal 4.

Of course, various improvements and alternatives described with relation to FIGS. 4 and 5 can be made to this structure.

It should be noted that FIG. 6B represents the triac surrounded by a P-type well 58. This is a practical example of a structure which could also be applied to the components schematically illustrated in FIGS. 2B, 4B and 5B.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A monolithic semiconductor component comprising:
    a first vertical thyristor having a gate, an anode, and a cathode;
    a resistor that couples the gate of the first vertical thyristor to the cathode of the first vertical thyristor;
    a lateral zener diode;
    a second vertical thyristor;
    a metallization that couples the lateral zener diode in series with the second vertical thyristor to form a series connection, the series connection of the lateral zener diode and the second vertical thyristor coupling the gate of the first vertical thyristor to the anode of the first vertical thyristor.

2. The monolithic semiconductor component of claim 1, wherein:
    the first thyristor includes a gate well; and
    the lateral zener diode is formed in the gate well of the first thyristor.

3. The monolithic semiconductor component of claim 1, wherein the first thyristor includes a gate well, the monolithic semiconductor component further comprising:
    a contact disposed between said metallization and the gate well of the first thyristor, whereby a resistor is formed in parallel with said lateral Zener diode.

4. The monolithic semiconductor component of claim 1, further comprising:
    a well formed in an upper surface of the monolithic semiconductor component; and
    a second diode, formed within the well, the second diode having a first terminal coupled to the metallization and a second terminal that provides an output terminal of the monolithic semiconductor component.

5. The monolithic semiconductor component of claim 1, wherein the first thyristor includes a cathode-gate well and the lateral zener diode includes an anode and a cathode, the monolithic semiconductor component further comprising a third lateral thyristor having a cathode formed in the cathode-gate well of the first thyristor, an anode coupled to the cathode of the lateral zener diode, and a gate coupled to the anode of the lateral zener diode.

6. The monolithic semiconductor component of claim 1, further comprising a third vertical thyristor coupled with the first vertical thyristor to form a triac.

7. The monolithic semiconductor component of claim 1, wherein the lateral zener diode includes an cathode, and wherein the second vertical thyristor includes a cathode that is coupled to the cathode of the lateral zener diode by the metallization.

8. The monolithic semiconductor component of claim 1, wherein the metallization forms an output terminal of the monolithic semiconductor component.

9. The monolithic semiconductor component of claim 1, in combination with a capacitor coupled between the metallization and the cathode of the first thyristor.

10. The monolithic semiconductor component of claim 9, in further combination with a control circuit coupled to the capacitor, the capacitor providing power to the control circuit when the first thyristor is activated.

11. The monolithic semiconductor component of claim 1, wherein the second vertical thyristor has an anode coupled to the anode of the first vertical thyristor and a cathode coupled to the lateral zener diode, the monolithic semiconductor component being in combination with a switch coupled between the gate of the second vertical thyristor and the anode of the second vertical thyristor.

12. An apparatus for providing control to a power signal, comprising:
    first means for activating a first switch to conduct current from the power signal to store a charge to provide a stored charge;
    second means for providing at least a portion of the stored charge to a control circuit to power the control circuit in response to the first means activating the first switch; and
    third means for operating the control circuit to control a second switch to conduct current from the power signal to control the power signal;
    wherein the first means is responsive to a signal provided by a manual switch.

13. A circuit comprising:
    a first switch having a first terminal that forms a first output terminal of the circuit a second terminal that forms a second output terminal of the circuit and a gate terminal;
    a second switch having a first terminal coupled to the first terminal of the first switch, a second terminal, and a gate terminal that forms an input terminal of the circuit;
    a voltage control device that couples the second terminal of the second switch to the gate terminal of the first switch so that the first switch is activated when a voltage across the voltage control device exceeds a predetermined voltage; and a switch that couples the first terminal of the second switch to the gate terminal of the second switch, to activate the second switch.

14. An integrated circuit comprising:

a first switch that is a first vertical thyristor having a first terminal that forms a first output terminal of the circuit a second terminal that forms a second output terminal of the circuit, and a gate terminal;

a second switch that is a second vertical thyristor having a first terminal coupled to the first terminal of the first vertical thyristor, a second terminal, and a gate terminal that forms an input terminal of the circuit;

a voltage control device that is a lateral zener diode that couples the second terminal of the second vertical thyristor to the gate terminal of the first vertical thyristor so that the first vertical thyristor is activated when a voltage across the lateral zener diode exceeds a predetermined voltage; and a metallization that couples the lateral zener diode to the second terminal of the second vertical thyristor;

wherein the integrated circuit is formed in a single substrate.

15. The circuit of claim 14, wherein:

the first thyristor includes a gate well; and the lateral zener diode is formed in the gate well of the first thyristor.

16. The circuit of claim 14, wherein the first thyristor includes a gate well, the circuit further comprising:

a contact disposed between said metallization and the gate well of the first thyristor, whereby a resistor is formed in parallel with said lateral Zener diode.

17. The circuit of claim 14, further comprising:

a well formed in an upper surface of the single substrate; and a second diode, formed within the well, the second diode having a first terminal coupled to the metallization and a second terminal that provides a third output terminal of circuit.

18. The circuit of claim 14, wherein the first thyristor includes a cathode-gate well and the lateral zener diode includes an anode and a cathode, the circuit further comprising a third lateral thyristor having a cathode formed in the cathode-gate well of the first thyristor, an anode coupled to the cathode of the lateral zener diode, and a gate coupled to the anode of the lateral zener diode.

19. An integrated circuit comprising:

a first switch that is a vertical triac comprising a first vertical thyristor coupled with a third vertical thyristor, said first vertical triac having a first terminal that forms a first output terminal of the circuit and a second terminal that forms a second output terminal of the circuit, and a gate terminal;

a second switch that is a second vertical thyristor having a first terminal coupled to the first terminal of the vertical triac, a second terminal, and a gate terminal that forms an input terminal of the circuit;

a voltage control device that is a lateral zener diode that couples the second terminal of the second vertical thyristor to the gate terminal of the vertical thyristor so that the vertical thyristor is activated when a voltage across the lateral zener diode exceeds a predetermined voltage; and a metallization that couples the lateral zener diode to the second terminal of the second vertical thyristor;

wherein the integrated circuit is formed in a single substrate.

20. The circuit of claim 19, wherein:

the first thyristor includes a gate well; and the lateral zener diode is formed in the gate well of the first thyristor.

21. The circuit of claim 19, wherein the first thyristor includes a gate well, the circuit further comprising:

a contact disposed between the metallization and the gate well of the first thyristor; and a resistor coupled in parallel with the lateral zener diode.

22. The circuit of claim 19, further comprising:

a well formed in an upper surface of the single substrate; and a second diode, formed within the well, the second diode having a first terminal coupled to the metallization and a second terminal that provides a third output terminal of circuit.

23. The circuit of claim 19, wherein the first thyristor includes a cathode-gate well and the lateral zener diode includes an anode and a cathode, the circuit further comprising a second lateral thyristor having a cathode formed in the cathode-gate well of the first thyristor, an anode coupled to the cathode of the lateral zener diode, and a gate coupled to the anode of the lateral zener diode.

24. The integrated circuit of claim 14 in combination with a switch coupled between the gate terminal of the second vertical thyristor and the first terminal of the second vertical thyristor.

* * * * *